(12) United States Patent
Nagasaka et al.

(10) Patent No.: US 7,364,372 B2
(45) Date of Patent: *Apr. 29, 2008

(54) METHOD OF MANUFACTURING OPTICAL MODULE

(75) Inventors: Kimio Nagasaka, Hokuto (JP); Masayuki Kikushima, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/599,411

(22) Filed: Nov. 15, 2006

(65) Prior Publication Data

US 2007/0117236 A1    May 24, 2007

(30) Foreign Application Priority Data

Nov. 18, 2005  (JP) .............................. 2005-334303

(51) Int. Cl.
G02B 6/36 (2006.01)

(52) U.S. Cl. .............................. 385/92; 385/53; 385/88

(58) Field of Classification Search ................. 385/53, 385/88, 92

See application file for complete search history.

(56) References Cited

U.S. PATENT DOCUMENTS

| | | | |
|---|---|---|---|
| 6,384,473 B1 | 5/2002 | Peterson et al. | |
| 6,588,949 B1 | 7/2003 | Zhou | |
| 6,660,944 B1 | 12/2003 | Murata et al. | |
| 6,809,852 B2 * | 10/2004 | Tao et al. | 359/290 |
| 6,830,949 B2 | 12/2004 | Senda et al. | |
| 6,932,522 B2 | 8/2005 | Zhou | |
| 2002/0072138 A1 | 6/2002 | Trezza et al. | |
| 2002/0072214 A1 | 6/2002 | Yuzawa et al. | |
| 2002/0074146 A1 | 6/2002 | Okubora | |
| 2004/0022502 A1 | 2/2004 | Zhou | |
| 2005/0105860 A1 | 5/2005 | Oono et al. | |
| 2005/0133928 A1 | 6/2005 | Howard et al. | |
| 2007/0189676 A1 * | 8/2007 | Nagasaka | 385/92 |

FOREIGN PATENT DOCUMENTS

| | | |
|---|---|---|
| JP | 05-029156 U | 4/1993 |
| JP | 09-172102 A | 6/1997 |
| JP | 11-265955 A | 9/1999 |
| JP | 2000-022012 A | 1/2000 |
| JP | 2001-257533 A | 9/2001 |
| JP | 2001-274653 A | 10/2001 |
| JP | 2002-534813 A | 10/2002 |
| WO | WO 01/82347 A1 | 11/2001 |

OTHER PUBLICATIONS

U.S. Appl. No. 11/599,410, Kimio Nagasaka et al., filed Nov. 15, 2006.

* cited by examiner

*Primary Examiner*—Jennifer Doan
(74) *Attorney, Agent, or Firm*—Oliff & Berridge, PLC

(57) ABSTRACT

A method of manufacturing an optical module having an optical element includes: (a) providing a housing having a base portion and a frame portion provided on the base portion; (b) providing a spacer on the base portion of the housing; (c) pressing the spacer to plastically deform the spacer; (d) bonding the optical element and the spacer; (e) disposing a cover member formed of a transparent substrate on the housing; and (f) providing a connector with a lens to surround the housing.

17 Claims, 7 Drawing Sheets

METHOD OF MANUFACTURING OPTICAL MODULE

Japanese Patent Application No. 2005-334303, filed on Nov. 18, 2005, is hereby incorporated by reference in its entirety.

BACKGROUND OF THE INVENTION

The present invention relates to a method of manufacturing an optical module.

An optical element such as a light-emitting element or a light-receiving element may be damaged by the external environment such as dust or moisture to deteriorate in performance. In order to prevent such a deterioration in performance, a method of sealing an optical element in a package has been developed. For example, JP-A-2002-534813discloses a sealing method in which an adhesive layer and a metal layer are formed to cover a photon device on a substrate.

In order to obtain excellent coupling efficiency when optically coupling an optical element and another device such as an optical fiber, it is necessary to accurately adjust the position of the optical element in the optical axis direction. However, when the structure of the package which accommodates the optical element is not precisely formed, it is difficult to accurately adjust the position of the optical element, for example.

SUMMARY

According to one aspect of the invention, there is provided a method of manufacturing an optical module including an optical element, the method comprising:
 (a) providing a housing having a base portion and a frame portion provided on the base portion;
 (b) providing a spacer on the base portion of the housing;
 (c) pressing the spacer to plastically deform the spacer; and
 (d) bonding the optical element and the spacer.

DETAILED DESCRIPTION OF THE EMBODIMENT

Figure 1:
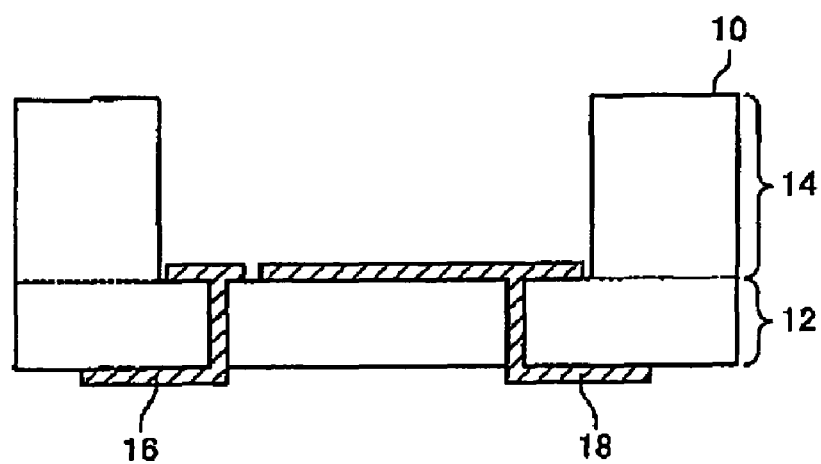
FIG. 1 is a cross-sectional view schematically showing a method of manufacturing an optical module according to one embodiment of the invention.

The invention may provide a method of manufacturing an optical module which can accurately adjust the position of an optical element in the optical axis direction.

According to one embodiment of the invention, there is provided a method of manufacturing an optical module including an optical element, the method comprising:
 (a) providing a housing having a base portion and a frame portion provided on the base portion;
 (b) providing a spacer on the base portion of the housing;
 (c) pressing the spacer to plastically deform the spacer; and
 (d) bonding the optical element and the spacer.

In this method of manufacturing an optical module, the housing may be formed of ceramics; and the step (a) may include integrating a frame member which forms the frame portion and a sheet member which forms the base portion by firing.

In this method of manufacturing an optical module, the spacer may have a protrusion which protrudes upward before plastic deformation.

In this method of manufacturing an optical module, the spacer may be formed of a conductive material.

In this method of manufacturing an optical module, the optical element may have an electrode on a surface facing the spacer.

In this method of manufacturing an optical module,
 the spacer may be a wire; and
 the step (b) may include:
 forming a conductive layer at a bottom portion inside the housing;
 bonding one end of the wire to the conductive layer; and
 bonding the other end of the wire to the conductive layer.

In this method of manufacturing an optical module, the spacer may be formed of a ball bump.

The method of manufacturing an optical module may further comprise: disposing a lens above the optical element after the step (d).

In this method of manufacturing an optical module,
 step (c) may include using a height adjustment jig having a first portion which faces the base portion and a second portion which faces the frame portion and has an upper surface positioned lower than an upper surface of the first portion, and limiting a pressure applied to the spacer by causing the first portion to press the spacer and the second portion to press an upper surface of the frame portion.

The method of manufacturing an optical module may further comprise:

providing a sealing member for bonding the housing and a cover member of the housing on an upper surface of the frame portion after the step (a).

In this method of manufacturing an optical module, the step (c) may include using a height adjustment jig having a first portion which faces the base portion and a second portion which faces the frame portion and has an upper surface positioned lower than an upper surface of the first portion, and causing the first portion to press the spacer and the second portion to press the sealing member.

In this method of manufacturing an optical module, the step (c) may be conducted after the steps (a), (b), and (d).

In this method of manufacturing an optical module, the steps (b) and (c) may be conducted after the steps (a) and (d).

In this method of manufacturing an optical module, the step (c) may include using a height adjustment jig having a first portion which faces the base portion and a second portion which faces the frame portion and has an upper surface positioned lower than an upper surface of the first portion, and limiting the pressure applied to the spacer by causing the first portion to press the optical element and the second portion to press an upper surface of the frame portion.

The method of manufacturing an optical module may further comprise:

providing a sealing member for bonding the housing and a cover member of the housing on an upper surface of the frame portion after the step (a).

In this method of manufacturing an optical module, the step (c) may include using a height adjustment jig having a first portion which faces the base portion and a second portion which faces the frame portion and has an upper surface positioned lower than an upper surface of the first portion, and causing the first portion to press the optical element and the second portion to press the sealing member.

In this method of manufacturing an optical module, the optical element may include a substrate and an optical portion formed on the substrate;

the height adjustment jig may have a depression in the first portion; and the step (c) may include pressing the optical element by using the first portion so that the optical portion is positioned in the depression.

Some embodiments of the invention will be described below, with reference to the drawings.

1. Method of Manufacturing Optical Module

FIGS. 1 to 7 are cross-sectional views showing a method of manufacturing an optical module.

First, a housing 10 is provided. As shown in FIG. 1, the housing 10 includes a base portion 12 and a frame portion 14 provided on the base portion 12. The base portion 12 and the frame portion 14 are formed of ceramics. A sheet member constituting the base portion 12 and a frame member constituting the frame portion 14 may be formed of a single layer or a stacked layer of a green sheet, which is unsintered ceramics containing alumina, for example. The frame member constituting the frame portion 14 is obtained by forming a hole in the green sheet. The green sheet may be processed to have a desired shape using a punching die, a punching machine, or the like. The size of the housing 10 can be adjusted by adjusting the number of green sheets used for the base portion 12 and the frame portion 14. An interconnect may be formed on the surface of each green sheet by printing or the like. The sheet member constituting the base portion 12 and the frame member constituting the frame portion 14 may be stacked and integrated by firing to form the housing 10. The upper surface of the frame portion 14 of the housing 10 may be subjected to surface treatment in order to ensure sufficient adhesion between the housing 10 and a sealing member 20 (described later).

As shown in FIG. 1, the housing 10 further includes a first interconnect 16 and a second interconnect 18. The first interconnect 16 and the second interconnect 18 are formed by forming holes in the sheet member constituting the base portion 12, and providing a conductive material in the holes. The first interconnect 16 and the second interconnect 18 are provided, running from the upper surface of the base portion 12 to the bottom surface thereof, each through a dedicated hole. The second interconnect 18 may be formed over the entire upper surface of the base portion 12 in a region in which an optical element (described later) is bonded.

Figure 2:
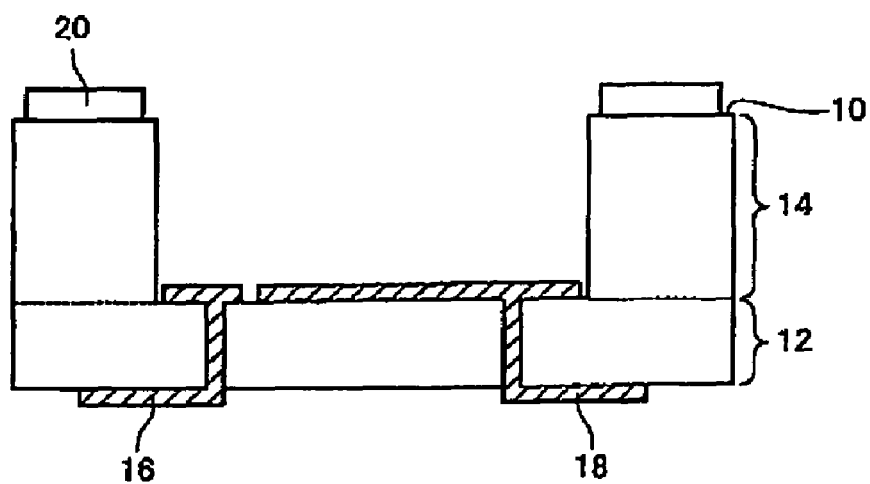
FIG. 2 is a cross-sectional view schematically showing a method of manufacturing an optical module according to one embodiment of the invention.

As shown in FIG. 2, the sealing member 20 is provided on the upper surface of the frame portion 14. The sealing member 20 is provided to bond a cover member 40 (described later) and the housing 10. Any material may be used for the sealing member 20 insofar as the material can bond the housing 10 and the cover member 40. The sealing member 20 may be formed of a thermoplastic insulating material or a metal material. For example, the sealing member 20 may be formed of a preform of low-melting-point glass. The sealing member 20 has a rectangular frame shape, for example.

Figure 3:
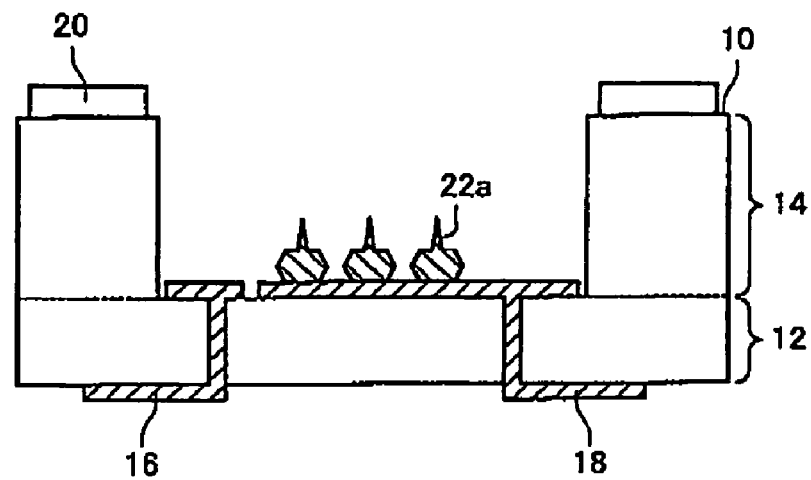
FIG. 3 is a cross-sectional view schematically showing a method of manufacturing an optical module according to one embodiment of the invention.

As shown in FIG. 3, spacers 22a are provided on the base portion 12 inside the housing 10. The spacer 22a has a protrusion which protrudes upward. The spacer 22a may be formed of a plastically deformable material, such as a ball bump. The ball bump is formed by first bonding a ball formed at the tip of a capillary to the housing 10 using a wire bonder, and cutting a wire protruding from the ball. The ball bump is first bonded only to the second interconnect 18 formed on the base portion 12. It is preferred that the spacer 22a be formed of a metal material such as gold. The ball bump is formed in a region where an optical element 30 (see FIG. 5) is provided. When the bottom surface of the optical element 30 has a size of 0.3 mm×0.3 mm, 3×3 ball bumps with a diameter of 0.1 mm are formed, for example.

Figure 4:
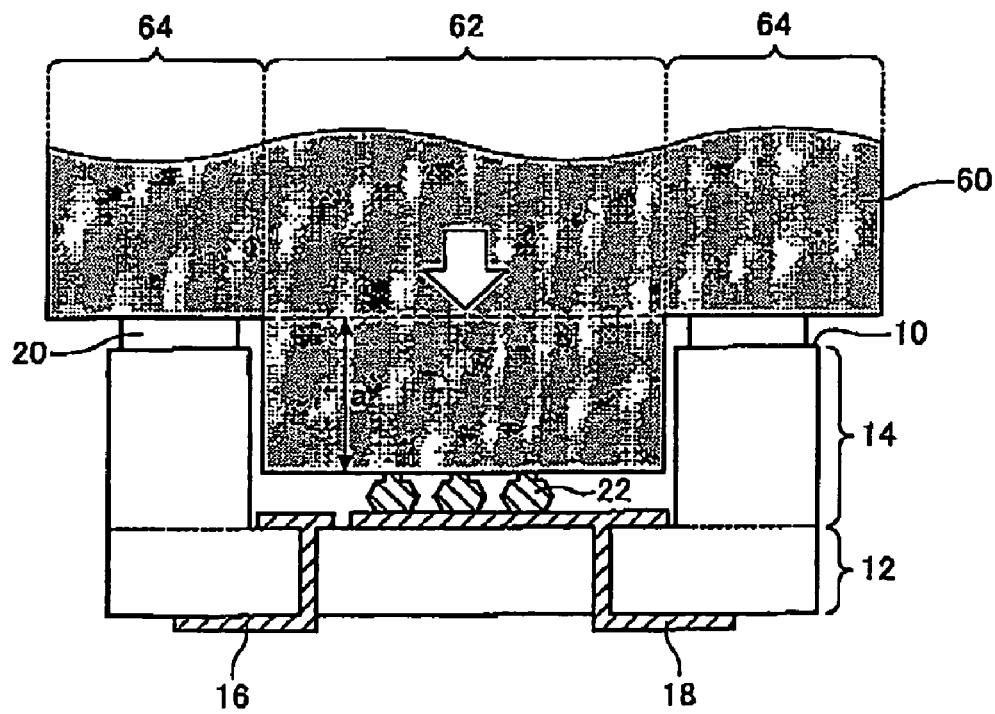
FIG. 4 is a cross-sectional view schematically showing a method of manufacturing an optical module according to one embodiment of the invention.

As shown in FIG. 4, the spacers 22a are plastically deformed by pressing using a height adjustment jig 60. The height adjustment jig 60 includes a first portion 62 facing the spacers 22a and a second portion 64 facing the frame portion 14, and has a convex shape as shown in FIG. 4. The upper surface of the first portion 62 is positioned higher than the upper surface of the second portion 64. The height adjustment jig 60 is provided so that the difference in height between the upper surface of the first portion 62 and the upper surface of the second portion 64 is an arbitrary distance "a". Any material may be used for the height adjustment jig 60 insofar as the material is harder than the sealing member 20 and the spacer 22a.

Specifically, the spacers 22a and the sealing member 20 are pressed using the height adjustment jig 60 in the direction indicated by the arrow shown in FIG. 4. In more detail, the first portion 62 presses the spacers 22a and the second portion 64 presses the sealing member 20. This allows the spacers 22a to be crushed and plastically deformed to form spacers 22 so that the difference in height between the spacers 22 and the sealing member 20 can be adjusted to the distance "a". Specifically, the height adjustment jig 60 is used so that the first portion 62 presses the spacers 22*a* and the second portion 64 presses the upper surface of the sealing member 20. This may allow the sealing member 20 to be crushed and plastically deformed. If the sealing member 20 is significantly harder than the spacers 22*a*, the sealing member 20 is not plastically deformed to limit the pressure applied to the spacers 22*a*, thereby preventing the spacers 22*a* from being excessively plastically deformed.

Figure 5:
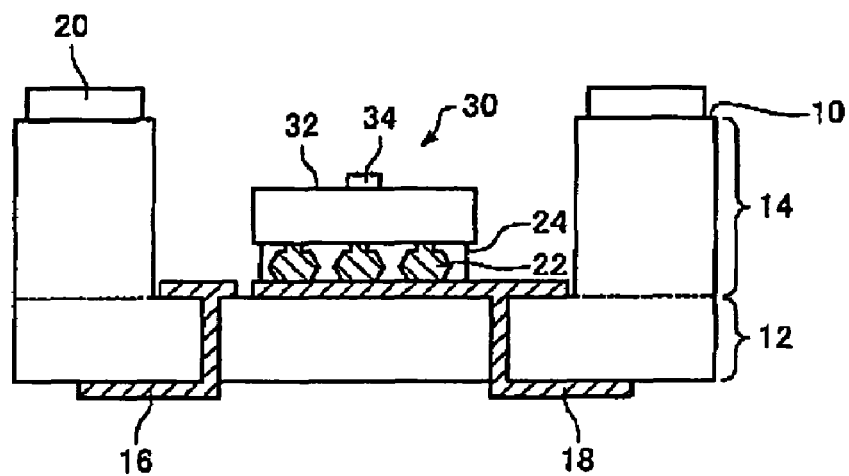
FIG. 5 is a cross-sectional view schematically showing a method of manufacturing an optical module according to one embodiment of the invention.

As shown in FIG. 5, the optical element 30 and the spacers 22 are bonded. First, a bonding member 24 is applied to fill the gap between the spacers 22. The optical element 30 is then disposed over the spacers 22 and the bonding member 24, and die-bonded while applying an appropriate load downward. As the bonding member 24, silver paste may be used, for example. The appropriate load as referred to herein means a load which does not cause the spacers 22 to be deformed.

The optical element 30 includes a substrate 32 and an optical portion 34 provided on the substrate 32. The optical element 30 may be a light-emitting element or a light-receiving element. The optical portion 34 is a portion which emits or receives light. The optical portion 34 of the light-emitting element may be a resonator of a surface-emitting semiconductor laser, for example. The optical portion 34 of the light-receiving element may be a light-absorption region, for example.

After the silver paste as the bonding member 24 has been hardened, a wire 36 and a wire 38 are bonded. The wire 36 electrically connects an electrode formed on the substrate 32 and the first interconnect 16. The wire 38 electrically connects an electrode formed on the substrate 32 and the second interconnect 18.

Figure 6:
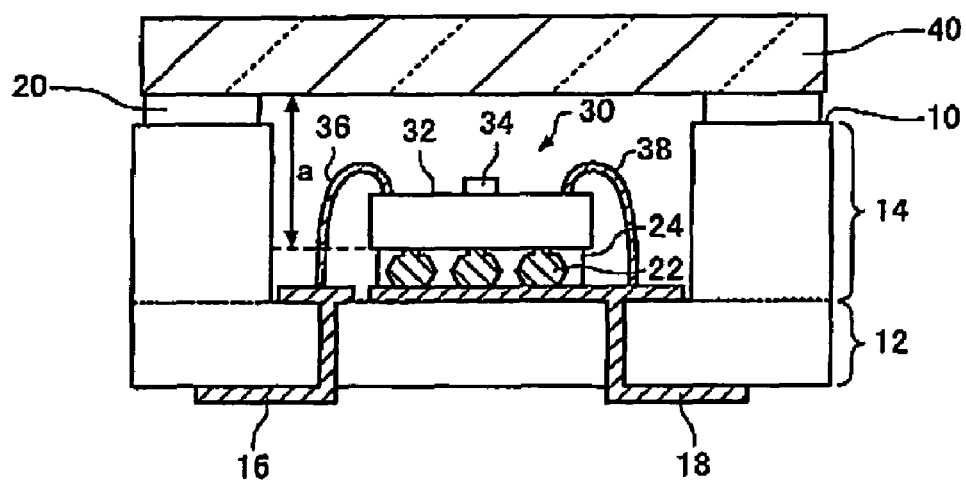
FIG. 6 is a cross-sectional view schematically showing a method of manufacturing an optical module according to one embodiment of the invention.

As shown in FIG. 6, the cover member 40 and the housing 10 are bonded through the sealing member 20. The sealing member 20 is heated while pressing the cover member 40 in the direction of the base portion 12 (downward). The sealing member 20 may be heated by applying a laser beam from above. The cover member 40 may be a transparent substrate which transmits light emitted from or received by the optical element 30. The cover member 40 may be formed of a glass substrate or the like. When using a glass substrate as the cover member 40, adhesion between the sealing member 20 and the cover member 40 can be improved by using low-melting-point glass as the material for the sealing member 20.

Figure 7:
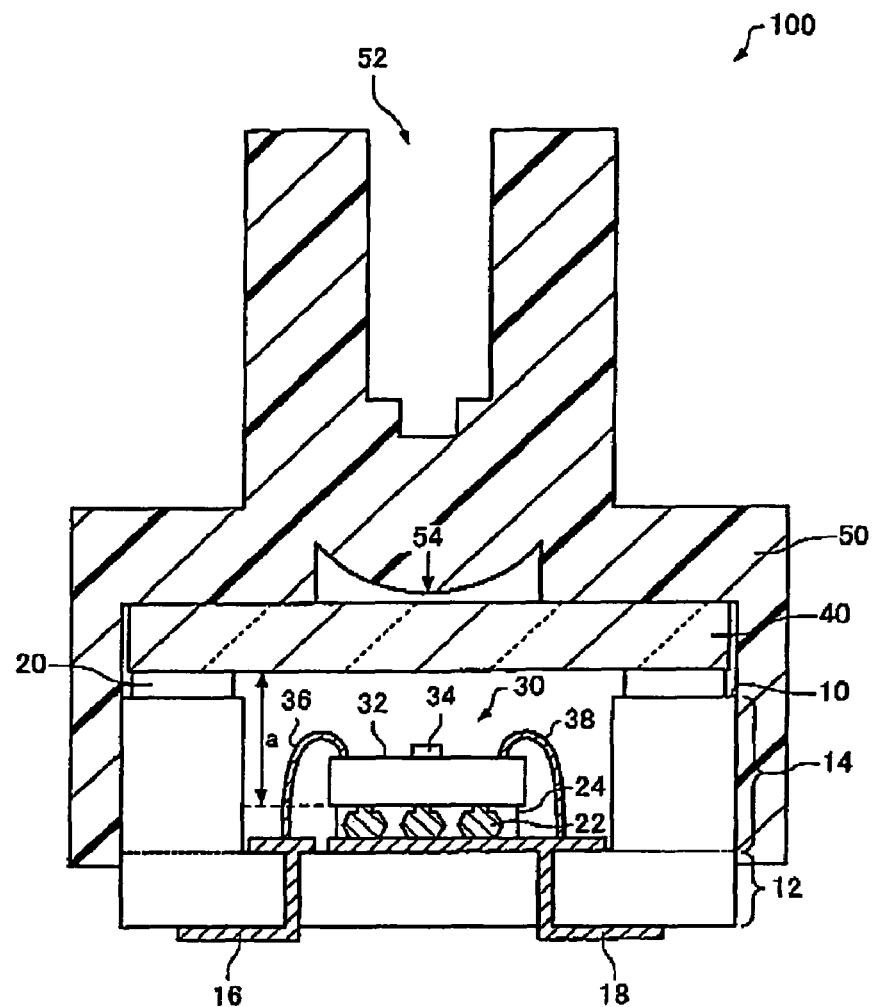
FIG. 7 is a cross-sectional view schematically showing an optical module according to one embodiment of the invention.

As shown in FIG. 7, a connector 50 with a lens is secured to the housing 10. The connector 50 with a lens includes a sleeve 52 and a lens portion 54. A ferrule or the like is inserted into the sleeve 52. The lens portion 54 is provided over the optical element 30, and condenses light emitted from the optical portion 34 or light entering from the outside. The connector 50 with a lens is provided to surround the frame portion 14.

The optical module 100 can be thus manufactured. In the method of manufacturing the optical module 100 according to this embodiment, the spacers 22*a* are crushed using the height adjustment jig 60, and the optical element 30 is disposed on the crushed spacers 22*a*. This allows the difference in height between the optical element 30 and the cover member 40 to be adjusted to the distance "a". Since the distance between the optical element 30 and the lens portion 54 can be accurately adjusted by precisely adjusting the distance between the optical element 30 and the cover member 40, the optical path can be highly controlled. As a result, optical coupling efficiency between the optical element 30 and an external device such as an optical fiber can be improved.

In the method of manufacturing the optical module 100 according to this embodiment, since the spacer 22*a* has a protrusion, the spacer 22*a* is easily plastically deformed by the height adjustment jig 60. As a result, the spacer 22 with an appropriate height can be formed. Since the spacer 22*a* is generally formed of a conductive material having a high thermal conductivity, the spacer 22 can exhibit excellent heat dissipation properties. In this embodiment, the electrode is provided on the upper surface of the optical element 30. Alternatively, the electrode may be provided on the side (underside) facing the spacer 22. When the electrode is provided on the underside of the optical element 30 and the spacer 22*a* is formed of a conductive material, it may be unnecessary to wire-bond the upper surface of the optical element 30 and the first interconnect 16 or the second interconnect 18, since the first interconnect 16 or the second interconnect 18 can be electrically connected with the optical element 30.

The spacer 22*a* and the sealing member 20 can be pressed simultaneously using the height adjustment jig 60 as shown in FIG. 4. This allows the difference in height between the upper surface of the sealing member 20 and the upper surfaces of the spacers 22 to be accurately adjusted, whereby the distance between the optical element 30 and the lens portion 54 can be accurately adjusted, even though the height of the base portion 12 of the housing 10 cannot be finely adjusted.

In the method of manufacturing the optical module according to this embodiment, the spacers 22*a* are plastically deformed after providing the sealing member 20. Alternatively, the spacers 22*a* may be plastically deformed before providing the sealing member 20. In this case, the first portion 62 of the height adjustment jig 60 presses the spacers 22*a*, and the second portion 64 presses the upper surface of the frame portion 14. As a result, the frame portion 14 can limit the pressure applied to the spacers 22*a*, thereby preventing the spacers 22*a* from being excessively plastically deformed.

2. Modification 2.1 First Modification

A method of manufacturing an optical module 200 (see FIG. 10) according to a first modification is described below. The optical module 200 differs from the optical module according to this embodiment in that a spacer 122*a* is bonded to the second interconnect 18 in two locations.

Figure 8:
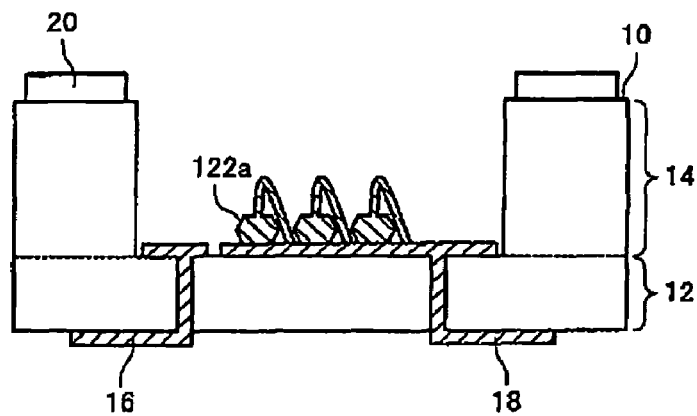
FIG. 8 is a cross-sectional view schematically showing a method of manufacturing an optical module according to a first modification.

The steps before forming the spacer 122*a* are the same as those described above. A ball formed at the tip of a capillary is first bonded to the second interconnect 18 using a wire bonder, and the other end of the wire is second-bonded to the second interconnect 18, whereby the spacer 122*a* is formed, as shown in FIG. 8.

Figure 9:
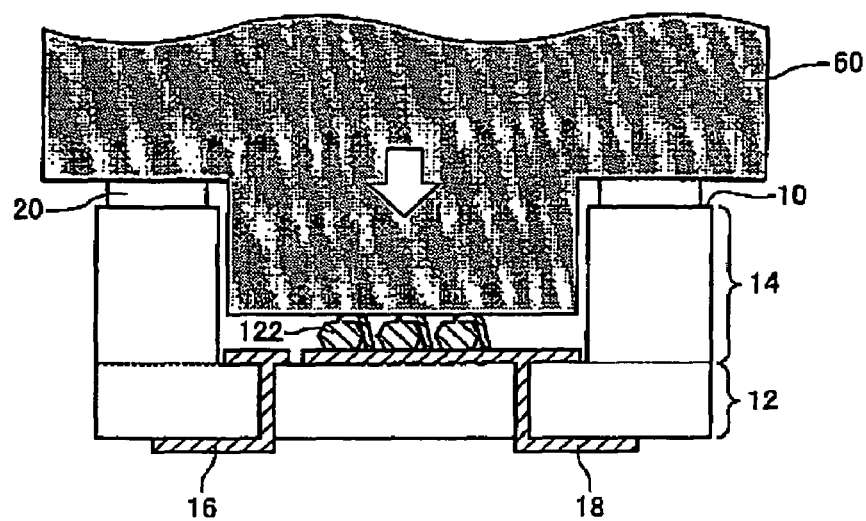
FIG. 9 is a cross-sectional view schematically showing a method of manufacturing an optical module according to the first modification.
Figure 10:
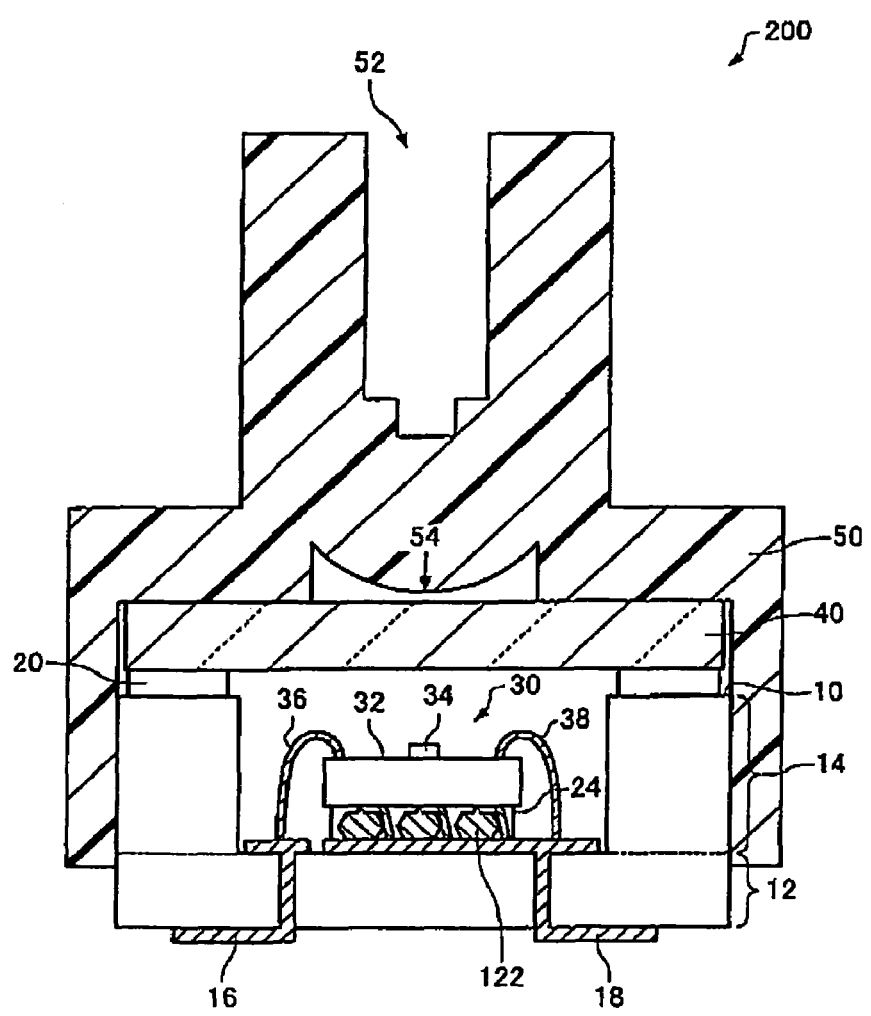
FIG. 10 is a cross-sectional view schematically showing an optical module according to the first modification.

As shown in FIG. 9, the spacers 122*a* are plastically deformed by pressing using the height adjustment jig 60, thereby forming spacers 122. The cover member 40 and the connecter 50 with a lens are provided as described above to obtain the optical module 200, as shown in FIG. 10.

Since each of the spacers 122 is bonded to the second interconnect 18 in two locations, electrical resistance can be decreased, whereby heat dissipation properties can be improved.

The configuration and the manufacturing steps of the optical module 200 other than those mentioned above are the same as the configuration and the manufacturing steps of the optical module 100, and further explanation is omitted.

2.2 Second Modification

A method of manufacturing an optical module according to a second modification is described below. The method of manufacturing an optical module according to the second modification differs from the method of manufacturing an optical module according to this embodiment in that the optical element 30 is disposed on spacers 222a before pressing using a height adjustment jig 260. The spacer 222a used in the method of manufacturing an optical module according to the second modification is similar to the spacer 122a used in the first modification. The configuration of the spacer 222a, however, is not limited thereto.

Figure 11:
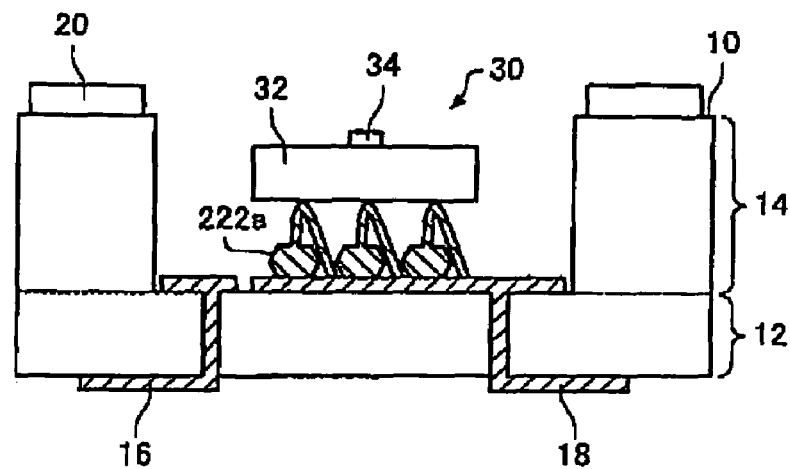
FIG. 11 is a cross-sectional view schematically showing a method of manufacturing an optical module according to a second modification.

After forming the spacers 222, the optical element 30 is disposed on the spacers 222a, as shown in FIG. 11. It is preferred that the spacers 222a be formed such that the spacers 222a have an equal height to allow the optical element 30 to be disposed thereon horizontally. Before disposing the optical element 30, the bonding member 24 may be applied to the gap between the spacers 222a or on the upper surfaces of the spacers 222a.

Figure 12:
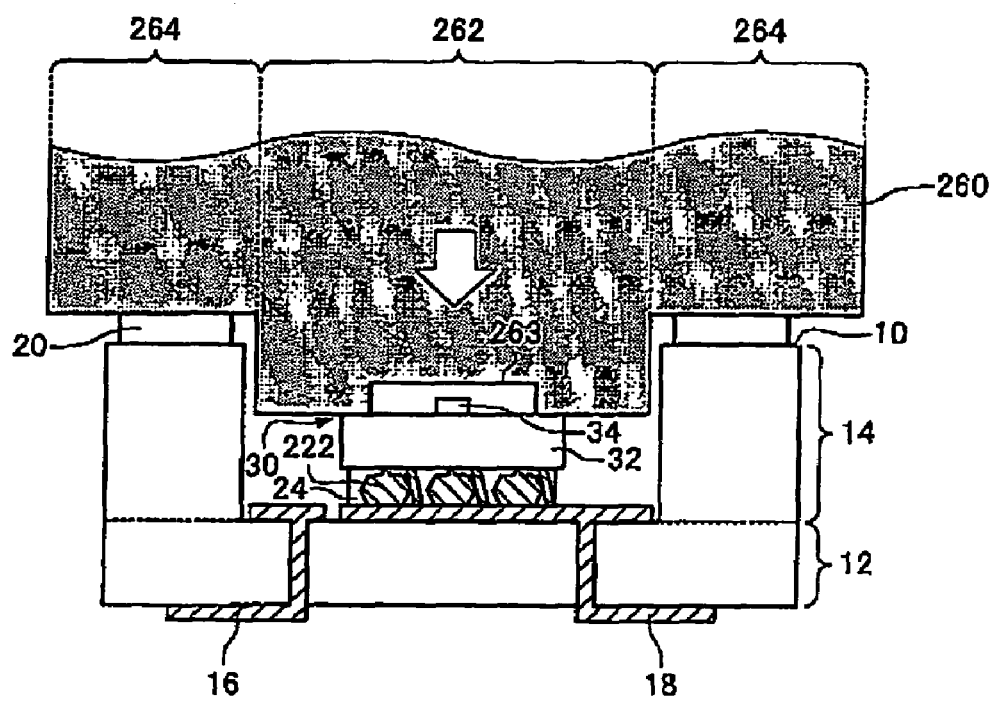
FIG. 12 is a cross-sectional view schematically showing a method of manufacturing an optical module according to the second modification.

Subsequently, the substrate 32 of the optical element 30 and the sealing member 20 are pressed using the height adjustment jig 260. The height adjustment jig 260 has a depression 263 in a first portion 262 facing the spacers 222a, as shown in FIG. 12. Specifically, the part of the first portion 262 excluding the depression 263 presses the substrate 32 of the optical element 30, and a second portion 264 presses the sealing member 20.

The depression 263 is provided at a position where the optical portion 34 can be accommodated in the depression 263 during pressing. This allows the optical element 30 to be pressed without damaging the optical portion 34 due to pressing. It is preferred that the depression 263 be formed in a region smaller than the substrate 32 in a plan view. It is preferred that the area surrounding the depression 263 be flat in the first portion 262. This allows the area surrounding the optical portion 34 of the optical element 30 to be pressed at a uniform pressure. The difference in height between the upper surface of the substrate 32 of the optical element 30 and the upper surface of the sealing member 20 can be accurately adjusted by pressing the optical element 30. This allows the distance between the optical portion 34 and the lens portion 54 to be adjusted without taking the thickness of the substrate 32 into consideration.

The step of disposing the cover member 40 and the subsequent steps are the same as those of the method of manufacturing an optical module according to this embodiment, and further explanation is omitted.

2.3 Third Modification

A method of manufacturing an optical module according to a third modification is described below. The method of manufacturing an optical module according to the third modification differs from the method of manufacturing an optical module according to this embodiment in that a spacer 322a is formed on the optical element 30 and then disposed on the housing 10.

Figure 13:
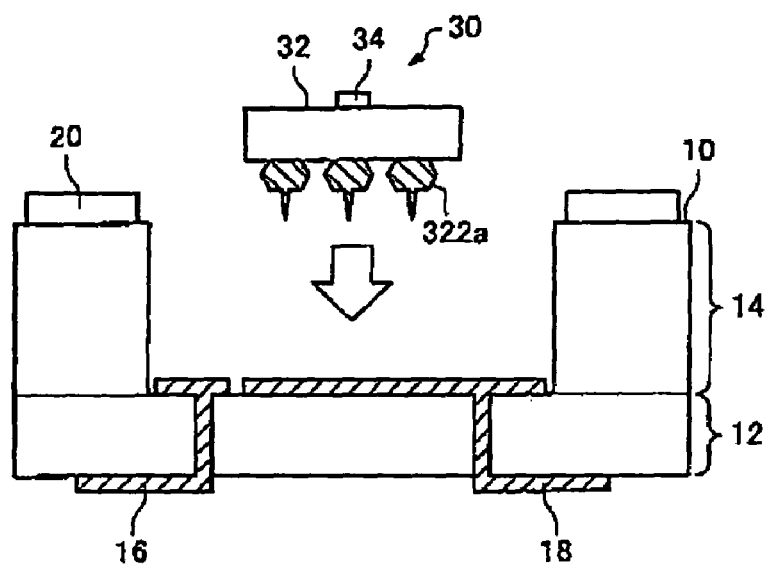
FIG. 13 is a cross-sectional view schematically showing a method of manufacturing an optical module according to a third modification.
Figure 14:
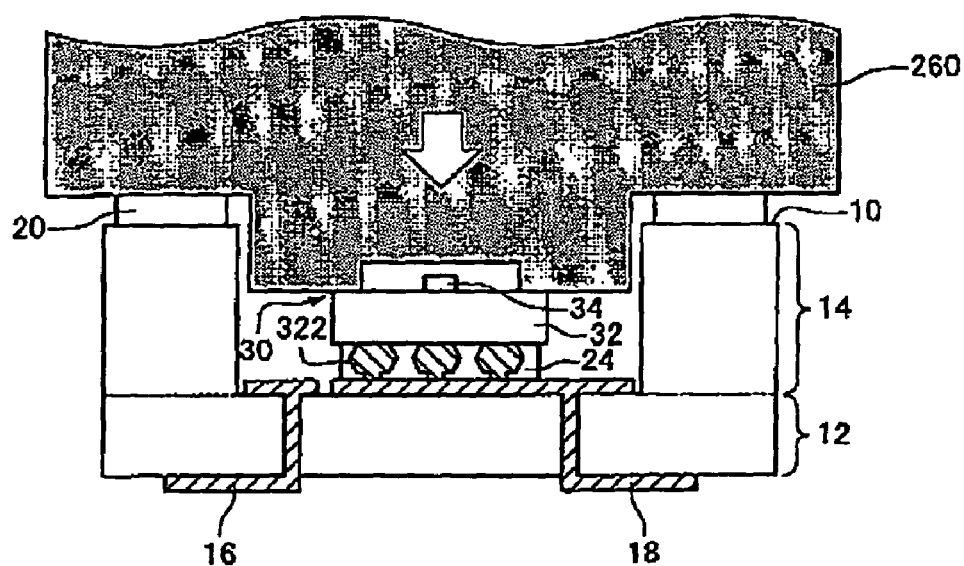
FIG. 14 is a cross-sectional view schematically showing a method of manufacturing an optical module according to the third modification.

As shown in FIG. 13, the spacers 322a are formed on the underside of the optical element 30. The spacer 322a is formed by a method similar to the method of forming the spacer 22a according to this embodiment. Specifically, the spacer 322a is formed by first bonding a ball formed at the tip of a capillary to the underside of the optical element 30 using a wire bonder, and cutting a wire protruding from the ball. The ball bump is first bonded only to the underside of the substrate 32. An electrode for driving the optical element 30 may be formed on the underside of the substrate 32.

The optical element 30 is disposed on the base portion 12 inside the housing 10. After applying the bonding member 24 in the gap between the spacers 322a or on the upper surfaces of the spacers 322a, the optical element 30 is disposed on the second interconnect 18 with the side of the spacer facing downward. The optical element 30 is then pressed using the height adjustment jig 260, and heated to bond the optical element 30 and the housing 10. The configuration of the height adjustment jig 260 according to the third modification is similar to that of the height adjustment jig 260 according to the second modification, and further explanation is omitted.

As described above, forming the spacers 322a on the optical element 30 in advance enables the spacers 322 to be disposed at appropriate positions on the optical element 30. The difference in height between the upper surface of the substrate 32 of the optical element 30 and the upper surface of the sealing member 20 can be accurately adjusted by pressing the optical element 30. This allows the distance between the optical portion 34 and the lens portion 54 to be adjusted without taking the thickness of the substrate 32 into consideration.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A method of manufacturing an optical module including an optical element, the method comprising:
    (a) providing a housing having a base portion and a frame portion provided on the base portion;
    (b) providing a spacer on the base portion of the housing;
    (c) pressing the spacer to plastically deform the spacer; and
    (d) bonding the optical element and the spacer;
    wherein step (c) includes using a height adjustment jig having a first portion which faces the base portion and a second portion which faces the frame portion and has an upper surface positioned lower than an upper surface of the first portion, and limiting a pressure applied to the spacer by causing the first portion to press the spacer and the second portion to press an upper surface of the frame portion.

2. The method of manufacturing an optical module as defined in claim 1,
    wherein the housing is formed of ceramics; and
    wherein the step (a) includes integrating a frame member which forms the frame portion and a sheet member which forms the base portion by firing.

3. The method of manufacturing an optical module as defined in claim 1,
wherein the spacer has a protrusion which protrudes upward before plastic deformation.

4. The method of manufacturing an optical module as defined in claim 1,
wherein the spacer is formed of a conductive material.

5. The method of manufacturing an optical module as defined in claim 4,
wherein the optical element has an electrode on a surface facing the spacer.

6. The method of manufacturing an optical module as defined in claim 3,
wherein the spacer is a wire; and
wherein the step (b) includes:
forming a conductive layer at a bottom portion inside the housing;
bonding one end of the wire to the conductive layer; and
bonding the other end of the wire to the conductive layer.

7. The method of manufacturing an optical module as defined in claim 3,
wherein the spacer is formed of a ball bump.

8. The method of manufacturing an optical module as defined in claim 1, further comprising:
disposing a lens above the optical element after the step (d).

9. The method of manufacturing an optical module as defined in claim 1, further comprising:
providing a sealing member for bonding the housing and a cover member of the housing on an upper surface of the frame portion after the step (a).

10. The method of manufacturing an optical module as defined in claim 9,
wherein the step (c) includes using a height adjustment jig having a first portion which faces the base portion and a second portion which faces the frame portion and has an upper surface positioned lower than an upper surface of the first portion, and causing the first portion to press the spacer and the second portion to press the sealing member.

11. The method of manufacturing an optical module as defined in claim 1,
wherein the step (c) is conducted after the steps (a), (b), and (d).

12. The method of manufacturing an optical module as defined in claim 1,
wherein the steps (b) and (c) are conducted after the steps (a) and (d).

13. The method of manufacturing an optical module as defined in claim 11,
wherein the step (c) includes using a height adjustment jig having a first portion which faces the base portion and a second portion which faces the frame portion and has an upper surface positioned lower than an upper surface of the first portion, and limiting the pressure applied to the spacer by causing the first portion to press the optical element and the second portion to press an upper surface of the frame portion.

14. The method of manufacturing an optical module as defined in claim 11, further comprising:
providing a sealing member for bonding the housing and a cover member of the housing on an upper surface of the frame portion after the step (a).

15. The method of manufacturing an optical module as defined in claim 14,
wherein the step (c) includes using a height adjustment jig having a first portion which faces the base portion and a second portion which faces the frame portion and has an upper surface positioned lower than an upper surface of the first portion, and causing the first portion to press the optical element and the second portion to press the sealing member.

16. The method of manufacturing an optical module as defined in claim 13,
wherein the optical element includes a substrate and an optical portion formed on the substrate;
wherein the height adjustment jig has a depression in the first portion; and
wherein the step (c) includes pressing the optical element by using the first portion so that the optical portion is positioned in the depression.

17. The method of manufacturing an optical module as defined in claim 15,
wherein the optical element includes a substrate and an optical portion formed on the substrate;
wherein the height adjustment jig has a depression in the first portion; and
wherein the step (c) includes pressing the optical element by using the first portion so that the optical portion is positioned in the depression.

* * * * *